United States Patent [19]
Lee et al.

[11] Patent Number: 6,110,541
[45] Date of Patent: Aug. 29, 2000

[54] CHEMICAL VAPOR DEPOSITION METHOD AND APPARATUS FOR HIGHLY TEXTURED DIAMOND FILM FORMATION

[75] Inventors: Jai-Young Lee; Yoon-Kee Kim; Yoon-Jung Yong; Young-Soo Han, all of Taejon, Rep. of Korea

[73] Assignee: Korea Advanced Institute of Science and Technology, Taejon, Rep. of Korea

[21] Appl. No.: 08/958,576

[22] Filed: Oct. 28, 1997

[30] Foreign Application Priority Data

Oct. 30, 1996 [KR] Rep. of Korea ...................... 96-49981

[51] Int. Cl.$^7$ ................................ B05D 3/06; C23C 16/00
[52] U.S. Cl. ........................ 427/577; 427/534; 427/249.8; 118/723 E; 118/728
[58] Field of Search ...................................... 427/577, 534, 427/249, 249.8; 117/929; 118/723 E, 728

[56] References Cited

U.S. PATENT DOCUMENTS 5,476,693  12/1995  Lee et al. ................................ 427/577

OTHER PUBLICATIONS

S.D. Wolter et al., *Textured Growth of Diamond on Silicon via in situ Carburiazation and Bias–Enhanced Nucleation*, Appl. Phys. Lett., vol. 62, No. 11, Mar. 1993, pp. 143–146.
S. Yugo et al., *Generation of Diamond Nuclei by Electric Field in Plasma Chemical Vapor Deposition*, Appl. Phys. Lett., vol. 58, No. 10, Mar. 1991, pp. 1036–1038.
B. R. Stoner et al., *In situ Growth Rate Measurement and Nucleation Enhancement for the Microwave Plasma CVD of Diamond*, J. Mater. Res., vol. 7, No. 2, Feb. 1992, pp. 257–260.

B.R. Stoner et al., *Characterization of Bias–Enhanced Nucleation of Diamond on silicon by in vacuo Surface Analysis and Transmission Electron Microsopy*, Phy. Rev. B, vol. 45, No. 19, May 1992, pp. 11067–11084.

X. Jiang et al., *Nucleation and Inital Growth Phase of Diamond Thin Films on (100) Silicon*, Phys. Rev. B, vol. 50, No. 12, Sep. 1994, pp. 11067–11084.

Y. Shigesato et al., *Emission Spectroscopy During Direct–Biased, Microwave–Plasma Chemical Vapor Deposition of Diamond*, Appl. Phys. Lett., vol. 63, No. 3, Jul. 1993, pp. 314–316.

*Primary Examiner*—Roy V. King
*Attorney, Agent, or Firm*—Darby & Darby

[57] ABSTRACT

The present invention relates to a CVD apparatus for highly textured diamond film formation and a method for forming a highly textured diamond film on the surface of a silicone substrate by generating a high density plasma so that each diamond film grain can have the same orientation as the substrate. The present inventors developed an improved chemical vapor deposition apparatus and a method for highly textured diamond film formation, on the ground that the nucleation density having a heteroepitaxy relation with a silicone substrate can be increased by modifying the substrate support and by generating a high density plasma right on the substrate while subjecting the whole substrate to the plasma. In accordance with the present invention, a diamond film which is close to a single crystal and has a heteroepitaxy relation with the crystalline orientation of a substrate can be formed in a simple manner.

9 Claims, 4 Drawing Sheets

Si[110] // diamond[110]

CHEMICAL VAPOR DEPOSITION METHOD AND APPARATUS FOR HIGHLY TEXTURED DIAMOND FILM FORMATION

FIELD OF THE INVENTION

The present invention relates to a chemical vapor deposition("CVD") apparatus and a method for highly textured diamond film formation, more specifically, to a CVD apparatus for highly textured diamond film formation and a method for forming a highly textured diamond film on the surface of a silicone substrate by generating a high density plasma so that each diamond film grain can have the same orientation as the substrate.

BACKGROUND OF THE INVENTION

In general, a diamond film should have a crystalline structure close to a single crystal in order that it may be used as a material for electronic devices. As one of approaches for manufacturing a textured diamond film, it has been suggested that a diamond film can be grown under the usual diamond film CVD conditions, by subjecting chemical vapor deposition on a substrate after applying a negative bias to the substrate to induce diamond nucleation and then, by removing the negative bias applied to the substrate (see: X. Jiang et al., Phys. Rev. B, 50:8402(1994)). Also, Wolter et al. proposed an in-situ process for manufacturing a textured diamond film which comprises the following steps: forming an interfacial layer on a silicone substrate via carburization before carrying out the diamond nucleation, applying a negative bias, and allowing the nuclei thus formed to grow under a specified growth condition of a single orientation (see: S. D. Wolter, Appl. Phys. Lett., 62:1215(1993)).

However, more than 90% of the nuclei formed by the application of a negative bias have been revealed to have a random orientation without a heteroepitaxy relation with a substrate. In order to overcome this problem, it is essential to maintain the growth rate of nuclei having the heteroepitaxy relation more faster than that of nuclei of random orientation, so that the diamond film can be of a highly textured surface. Therefore, the prior art method has proven to be less satisfactory in a sense that deposition of a film with a thickness of more than 5 μm is essentially accompanied, to obtain a diamond film with a heteroepitaxy.

Moreover, since nuclei at the similar orientation to the heteroepitaxy are not discriminated from nuclei with the heteroepitaxy in terms of the growth rates, film grains of the nuclei do not accomplish a complete heteroepitaxy, and have a disagreed azimuth which in turn provides a crystalline structure different from a single crystal due to the presence of tilt. Actually, only below 50% of grains have an orientation when a diamond film is manufactured according to the above method.

Stoner et al. reported that the higher nucleation density can be obtained in a relatively short period when a strong plasma is formed near a substrate and a strong negative bias is applied to the substrate (see: B. R. Stoner et al., J. Mater. Res., 7:257(1992)). Also, Shigesato et al. proposed that the amount of hydrogen and the temperature of electron in a plasma around a substrate may be increased by applying a negative bias to the substrate and such a change in the plasma may play an important role of increasing the diamond nucleation density (see: Y. Shigesato et al., Appl. Phys. Letter, 63:314(1993)).

However, the conventional methods for manufacturing a diamond film has revealed a shortcoming that only the surface of a substrate can be contacted with a plasma, since a substrate is placed outside of the plasma or the surface of the substrate is made to contact with the plasma. Moreover, even though the substrate is inserted to the inside of the plasma, the said problem cannot be solved, since the substrate support of the CVD apparatus is much larger than the surface of the substrate.

SUMMARY OF THE INVENTION

In this regard, the present inventors developed an improved chemical vapor deposition apparatus and a method for highly textured diamond film formation, on the ground that the nucleation density having a heteroepitaxy relation with a silicone substrate can be increased by modifying the substrate support and by generating a high density plasma right on the substrate while subjecting the whole substrate to the plasma. In accordance with the present invention, a diamond film which is close to a single crystal and has a heteroepitaxy relation with the crystalline orientation of a substrate can be formed in a simple manner.

A primary object of the present invention is, therefore, to provide a novel chemical vapor deposition (CVD) apparatus for a highly textured diamond film formation.

The other object of the invention is to provide a method for forming the highly textured diamond film by employing the CVD apparatus.

BRIEF DESCRIPTION OF DRAWINGS

The above and the other objects and features of the present invention will become apparent from the following description given in conjunction with the accompanying drawings, in which.

DETAILED DESCRIPTION OF THE INVENTION

The CVD apparatus of the present invention is designed so that a disk-type high density plasma can be generated by installing a graphite block to a substrate support of a conventional bell-jar type microwave plasma CVD apparatus.

Figure 1:
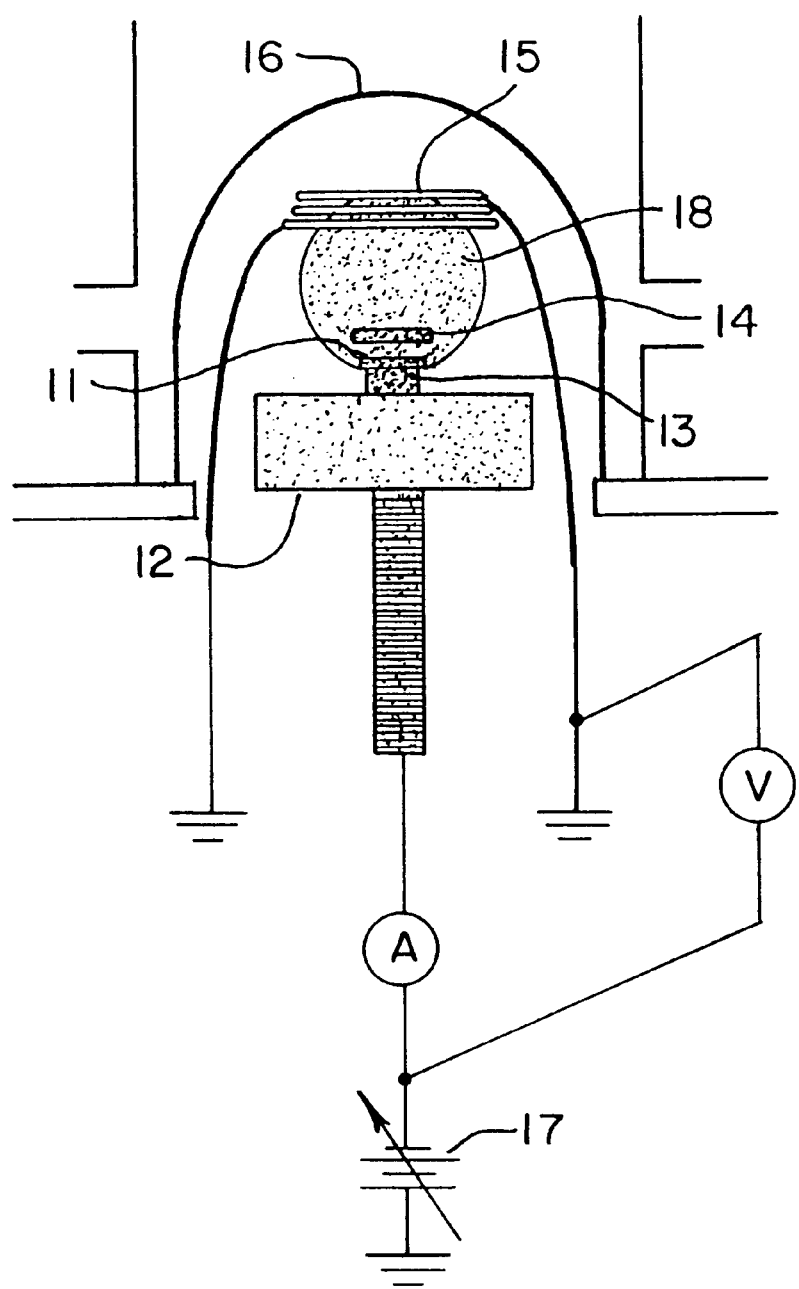
FIG. 1 is a schematic diagram depicting a chemical vapor deposition apparatus of the present invention.

FIG. 1 is a diagram depicting the schematic structure of a CVD apparatus of the invention, where a reactive tube of a bell-jar type microwave plasma CVD apparatus is provided.

Referring to FIG. 1, CVD apparatus of the present invention comprises:

a substrate support (12) for loading a substrate (11) on which a diamond film is formed;

a graphite block (13) with the same shape and size as the substrate (11), being provided on the substrate support (12) to generate a disk-type high density plasma;

a negative bias supplier (17) connected to the graphite block (13) to supply a negative bias to the substrate (11) loaded on the graphite block (13);

In the method for forming the highly textured diamond film, the plasma (18) is generated at a region between the substrate (11) and an electrode (15) to ease the growth of a diamond film on the substrate. As shown in FIG. 1, a disk-type high-density plasma (14) is formed on the surface of the substrate which increases the density of diamond film nucleation on the surface of the substrate (11).

Specified conditions for the steps constituting the method for forming a diamond film of the invention, are summarized in the Table 1 below;

TABLE 1

Conditions for the method for a diamond film formation

| Parameters | Etching-Washing | Carburization treatment | Negative bias treatment | Film growth |
|---|---|---|---|---|
| Methane Conc. in Plasma(%) | 0 | 2 | ~5 | 0.8 |
| Pressure(Torr) | 15 | 15 | 5 ~ 40 | 20 |
| Temp. of Substrate(° C.) | ~800 | ~800 | ~800 | ~850 |
| Negative bias(V) | 0 | 0 | −100 ~ −250 | 0 |
| Microwave output(W) | 700 | 700 | 700 | 800 |
| Growth Time(minute) | 10 | 30 ~ 60 | 10 | 60 ~ 300 | an electrode (15) located on the upper side of the graphite block (13), being connected to the ground of the negative bias supplier (17) to constitute a closed circuit; and, a quartz dome (16) for closing the substrate support (12), the graphite block (13) and the electrode (15).

In the CVD apparatus of the invention, the said electrode (15) is formed in a spiral plane, preferably, in a form of a rod which is spirally wound with a kanthal thread around a stainless tube.

The said quartz dome (16) which constitutes a non-conductive reactive tube, is filled with a hydrogen gas containing 10% methane. In the course of carburization, the percentage of methane is reduced to 2%. Temperature inside of the quartz dome (16) is controlled by a heat coil (not described) placed in the substrate support (12).

The operation mode of the CVD apparatus of the invention is described in more detail, accompanying with a method for forming a diamond film employing the apparatus.

A silicone substrate (11) with a specified crystalline orientation (for example, the orientation of (100) of FIG. 3(B)) is loaded on a graphite block (13) installed on a substrate support (12) and the inside of a reactive tube is subjected to a vacuum condition of below 5×10⁻³ Torr using a vacuum pump. Then, the temperature of the substrate (11) is elevated to a temperature enabling the diamond film formation by employing a heat coil of the substrate support (12) while flowing hydrogen gas over the substrate (11).

When the temperature of the substrate (11) reaches to a predetermined range, the surface of the substrate (11) is etching-washed by generating a plasma using only hydrogen gas ("etched washing step"), and flow of a hydrogen gas containing 2% methane is allowed to initiate a reaction ("carburization step"). After the carburization for a period, a negative bias is applied to the substrate (11) to proceed the reaction under a specific condition for negative bias treatment ("negative bias treatment step"). And then, the reaction is allowed to proceed under a reset condition for the film growth ("film growth step").

Figure 2:
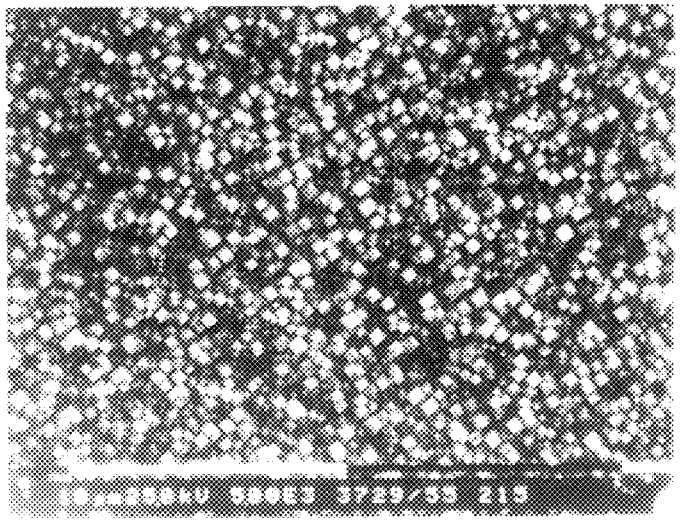
FIG. 2 is a SEM micrograph showing the surface of a diamond film formed by the chemical vapor deposition apparatus.

Referring to FIG. 2, a scanning electron microscope (SEM) micrograph showing the surface of a diamond film is provided. Etching-washing treatment of a silicone substrate with the orientation of (100) is carried out by generating a hydrogen plasma for 10 minutes, the carburization under a plasma containing 2% methane is followed for 60 minutes at the pressure of 15 Torr, and after negative bias treatment of the substrate for 10 minutes under the appliance of the voltage of −250V, a diamond film is grown for 5 hours at a pressure of 30 Torr under a plasma containing 0.8% of methane. In particular, FIG. 2 shows a highly textured diamond film with grains of below 1 μm which appears to be perfectly oriented.

Figure 3A:
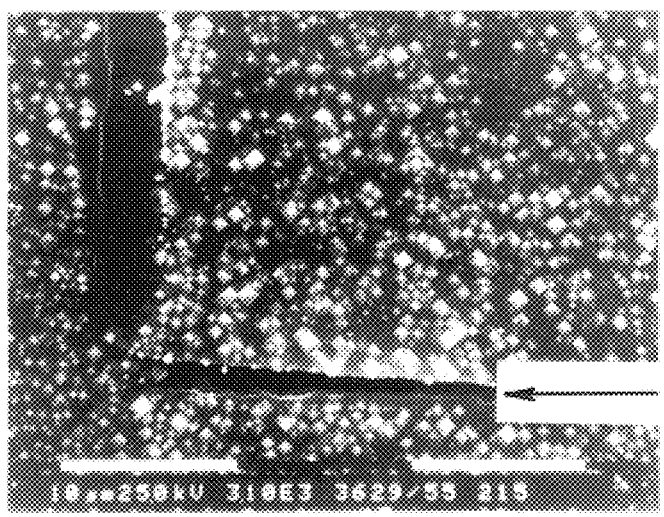
FIG. 3(A) is a SEM micrograph showing an orientation relationship between a silicone substrate and grains of diamond film formed by the chemical vapor deposition apparatus.
Figure 3B:
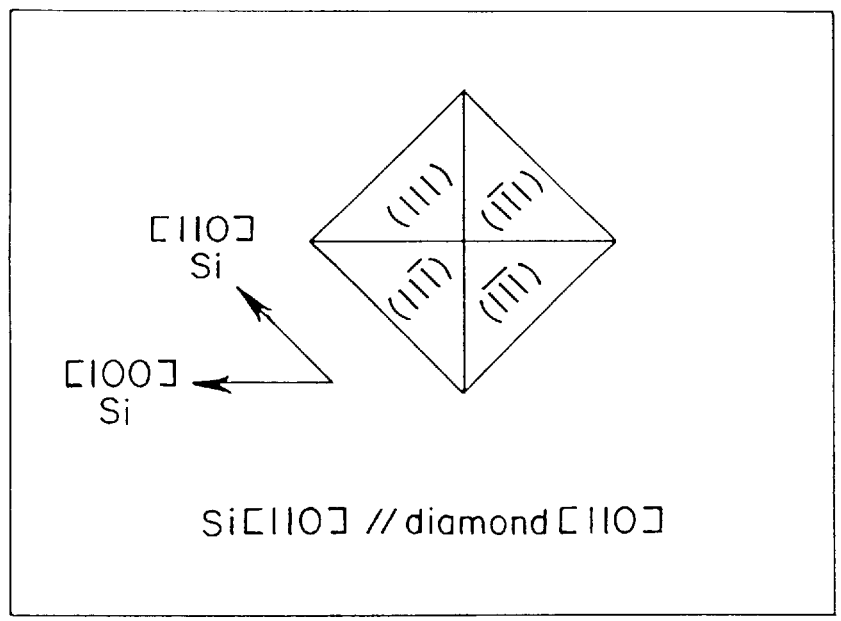
FIG. 3(B) is a schematic diagram showing an orientation relationship between a silicone substrate and grains of diamond film formed by the chemical vapor deposition apparatus.

FIG. 3(A) is a SEM micrograph showing an orientation relationship between a silicone substrate and grains of diamond film formed by the method described above, and FIG. 3(B) is a schematic diagram showing the orientation relationship between the silicone substrate and grains of the diamond film. Referring to FIG. 3(A), etching is conducted on the slot with the orientation of (100) to show the orientation relationship between the silicone substrate and grains of diamond film. As can be seen in FIG. 3(A), it is clear that an etching slot is located at an angle of about 45° against the side of grains of diamond film.

FIGS. 2 and 3(A) show the grains, being viewed from the right angle of the substrate, which indicates that the visible side is in parallel with the substrate. Therefore, as shown in FIG. 3(B), the corner of grains of diamond film has a crystalline orientation coinciding with the orientation (110) of the silicone substrate. From the point of view, it is clearly demonstrated that the diamond film formed by employing CVD apparatus of the invention has a heteroepitaxy relationship of Si (110)//Diamond film (110) and Si (110)//Diamond film (110).

Figure 4A:
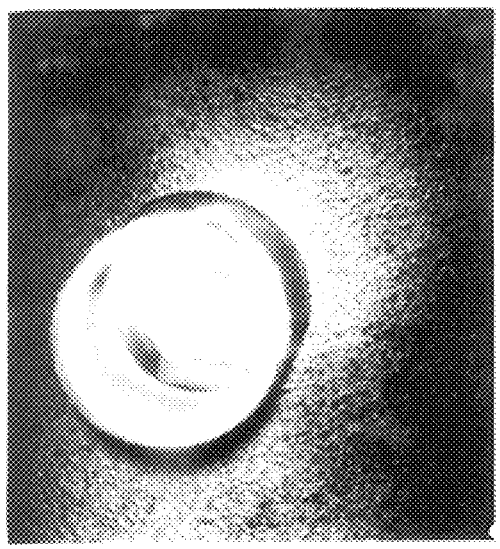
FIG. 4(A) is a photograph showing a plasma generated on a substrate by the chemical vapor deposition apparatus of the invention.
Figure 4B:
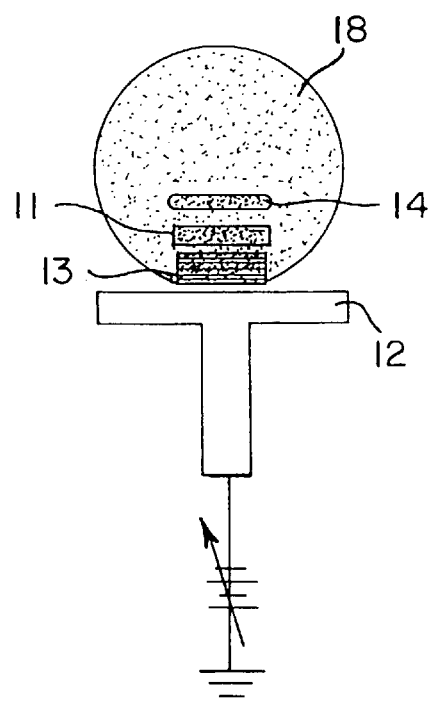
FIG. 4(B) is a schematic diagram showing a plasma generated on a substrate by the chemical vapor deposition apparatus of the invention.

FIG. 4(A) is a photograph showing a plasma generated on a substrate during a negative bias treatment and FIG. 4(B) is a schematic diagram showing a plasma generation by CVD apparatus of the invention. When the negative bias treatment is conducted without placing a graphite block on a substrate support, the silicone substrate becomes contact with a ball-type plasma. However, when a negative bias is applied to the substrate (11) loaded on the graphite block (13), a bright, disk-type plasma (14) of high density is generated on the immediate top (1~2 mm) of the surface of the substrate (11). Actually, since the highly textured diamond film shown in FIGS. 2, 3(A) and 3(B) is generated only when the disk-type plasma is formed on the surface of the substrate, such a change in plasma is considered to play a role of increasing the density of nucleation of the diamond film with a heteroepitaxy orientation relationship.

Figure 5:
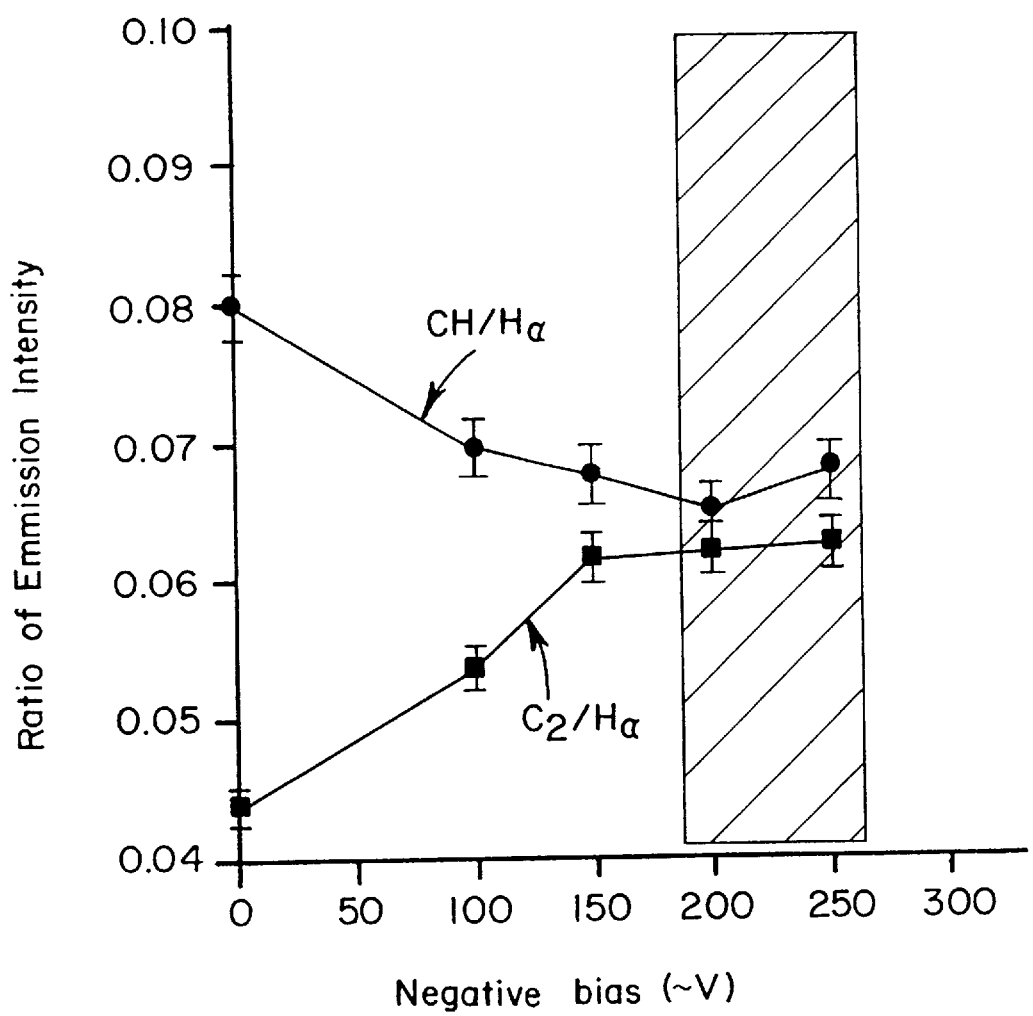
FIG. 5 is a graph showing the relationship between a negative bias and $CH/H_\alpha$ and $C_2/H_\alpha$.

FIG. 5 shows the relative amount of reactive particles in the disk-type high density plasma, which is analyzed by using an optical emission spectroscopy. The ratio of $H_\alpha$ peak value observed at 656.3 nm which is related to the atomic hydrogen and CH peak value observed at 431.4 nm which is related to the formation of diamond film, i.e., $CH/H_\alpha$, and the ratio of $H_\alpha$ peak value and $C_2$ peak value observed at 473.7 nm, i.e., $C_2/H_{60}$, are changed to the linear form depending on the increase of the negative bias value applied to the substrate (11) and then, to be converged into a specified value on the appliance of the electrical potential of below −200V. Accordingly, it can be concluded that the disk-type high density plasma may be formed at the area in which $CH/H_\alpha$ and $C_2/H_\alpha$ are kept at constant values.

As clearly illustrated and demonstrated as above, the present invention provides a chemical vapor deposition (CVD) apparatus for a highly textured diamond film formation which comprises a graphite block installed between a substrate and a substrate support, to increase the nucleation density of a diamond film having a heteroepitaxy relation with the substrate, and a method for forming the highly textured diamond film on a silicone substrate by generating a disk-type high density plasma with a constant value of $CH/H_\alpha$ and $C_2/H_\alpha$ on the silicone substrate of a specified orientation.

Although the preferred embodiments of the present invention have been disclosed for illustrative purpose, those who are skilled in the art will appreciate that various modifications, additions and substitutions are possible, without departing from the scope and spirit of the invention as disclosed in the accompanying claims.

What is claimed is:

1. A chemical vapor deposition (CVD) apparatus for a highly textured diamond film formation on the surface of a silicon substrate, said diamond film having almost perfect orientation, which comprises:
   substrate supporting means for loading the substrate on which a diamond film is formed;
   a graphite member with the same shape and size as the substrate, being provided on the substrate supporting means;
   negative bias supplying means for the supply of a negative bias to the substrate loaded on the graphite member, being connected to the graphite member;
   an electrode located on the upper side of the graphite member for closing the circuit with said negative bias supplying means, said electrode being spaced apart from the graphite member; and means for closing of the substrate supporting means, the graphite member and the electrode, respectively.

2. The chemical vapor deposition (CVD) apparatus of claim 1, wherein the graphite member is a graphite block with the same shape and size as the substrate.

3. The chemical vapor deposition (CVD) apparatus of claim 1, wherein the closing means is made of a non-conductive material.

4. The chemical vapor deposition (CVD) apparatus of claim 3, the closing means is a quartz dome which is filled with a hydrogen gas containing methane.

5. The chemical vapor deposition (CVD) apparatus of claim 4, temperature of the quartz dome is controlled by a heat coil placed in the substrate supporting means.

6. The chemical vapor deposition (CVD) apparatus of claim 1, wherein the electrode is in the shape of a rod, both ends of which are grounded and used to close a circuit.

7. In a method of forming a highly textured diamond film which comprises the steps of:
   etched washing of the surface of a silicon substrate by generating a plasma using hydrogen gas;
   carburization to initiate a reaction by flowing a hydrogen gas containing 2% methane;
   negative bias treatment to proceed the reaction by applying a negative bias to the substrate for a specified period; and
   film growth,
   the improvement comprising the generation of a disk-shaped high density plasma, said disk shape increasing the density of nucleation of the diamond film, at a location apart from the substrate by employing a chemical vapor deposition (CVD) apparatus for the highly textured diamond film formation on the surface of the silicon substrate, said diamond film having almost perfect orientation, which comprises:
   substrate supporting means for loading the substrate on which the diamond film is formed;
   a graphite member with the same shape and size as the substrate, being provided on the substrate supporting means;
   negative bias supplying means for the supply of a negative bias to the substrate loaded on the graphite member, being connected to the graphite member;
   an electrode located on the under side of the graphite member for closing the circuit with said negative bias supplying means, said electrode being spaced apart from the graphite member; and
   means for closing of the substrate supporting means, the graphite member and the electrode, respectively.

8. The method for forming a highly textured diamond film of claim 7, wherein the plasma is generated with the same size and shape as the substrate.

9. The method for forming a highly textured diamond film of claim 7, the plasma is generated at a region between the substrate and the electrode.

* * * * *